(12) United States Patent
Hirai et al.

(10) Patent No.: US 12,340,974 B2
(45) Date of Patent: Jun. 24, 2025

(54) HYDROGEN SUPPLY DEVICE, AND ION BEAM IRRADIATION APPARATUS EQUIPPED THEREWITH

(71) Applicant: NISSIN ION EQUIPMENT CO., LTD., Koka (JP)

(72) Inventors: Yuya Hirai, Koka (JP); Weijiang Zhao, Koka (JP); Suguru Itoi, Koka (JP); Yuta Iwanami, Koka (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 574 days.

(21) Appl. No.: 17/861,463

(22) Filed: Jul. 11, 2022

(65) Prior Publication Data
US 2023/0008178 A1 Jan. 12, 2023

(30) Foreign Application Priority Data
Jul. 12, 2021 (JP) .................................. 2021-114967

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/002* (2013.01)

(58) Field of Classification Search
CPC .. H01J 37/08; H01J 37/3171; H01J 37/32458; H01J 2237/002; H01J 2237/006
See application file for complete search history.

(56) References Cited

U.S. PATENT DOCUMENTS

| 8,101,488 B1 | 1/2012 | Smick et al. |
| 2019/0228943 A1 | 7/2019 | Colvin et al. |
| 2020/0395193 A1* | 12/2020 | Hsu ..................... H01J 37/3171 |

FOREIGN PATENT DOCUMENTS

JP 07-245196 A 9/1995

* cited by examiner

*Primary Examiner* — Sean M Luck
(74) *Attorney, Agent, or Firm* — Sughrue Mion, PLLC

(57) ABSTRACT

A hydrogen supply device disposed in a high-potential section includes a bottle internally provided with a hydrogen absorbing alloy.

20 Claims, 8 Drawing Sheets

Broken line: 0°C
One-dot chain line: 20°C
Two-dot chain line: 50°C

HYDROGEN SUPPLY DEVICE, AND ION BEAM IRRADIATION APPARATUS EQUIPPED THEREWITH

CROSS-REFERENCE TO RELATED APPLICATION

This application claims priority from Japanese Patent Application No. JP 2021-114967, filed in the Japanese Patent Office on Jul. 12, 2021, the disclosure of which is incorporated by reference herein in its entirety.

BACKGROUND

1. Field

Various embodiments relate to a hydrogen supply device for supplying hydrogen gas, and an ion beam irradiation apparatus equipped with the hydrogen supply device.

2. Description of Related Art

When a dopant gas containing a halogen component such as boron trifluoride (BF3) or phosphorus trifluoride (PF3) is used in an ion implantation apparatus, the halogen component reacts with component parts of an ion source into which the dopant gas is introduced, to form a halogen compound.

The halogen compound deposits on a member in an area having a relatively low temperature, thereby causing problems such as causing the member to become insulative and causing the occurrence of electrical discharge.

As a countermeasure against these problems, a hydrogen gas may be introduced into the ion source together with the dopant gas. In this way, ions of the halogen component produced when the dopant gas is plasmatized will combine with the hydrogen gas introduced into the ion source, and the resulting compound will be discharged outside the apparatus in the form of gas. This countermeasure reduces the deposition of the halogen compound that is a cause of the above problems.

SUMMARY

It is an aspect to provide a hydrogen supply device disposed in a high-potential section.

According to an aspect of one or more embodiments, there is provided a hydrogen supply device disposed in a high-potential section, the hydrogen supply device comprising a bottle internally provided with a hydrogen absorbing alloy.

According to another aspect of one or more embodiments, there is provided an ion beam irradiation apparatus comprising an ion source; and the hydrogen supply device, the hydrogen supply device supplying a hydrogen gas to the ion source.

According to another aspect of one or more embodiments, there is provided an ion beam irradiation apparatus comprising a housing; a gas box disposed in the housing; an ion source disposed in the housing; and one or more insulator disposed between the housing and each of the gas box and the ion source, wherein the gas box includes the hydrogen supply device, and the hydrogen supply device supplies a hydrogen gas to the ion source through a pipe that passes through a wall of the gas box.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

Figure 1:
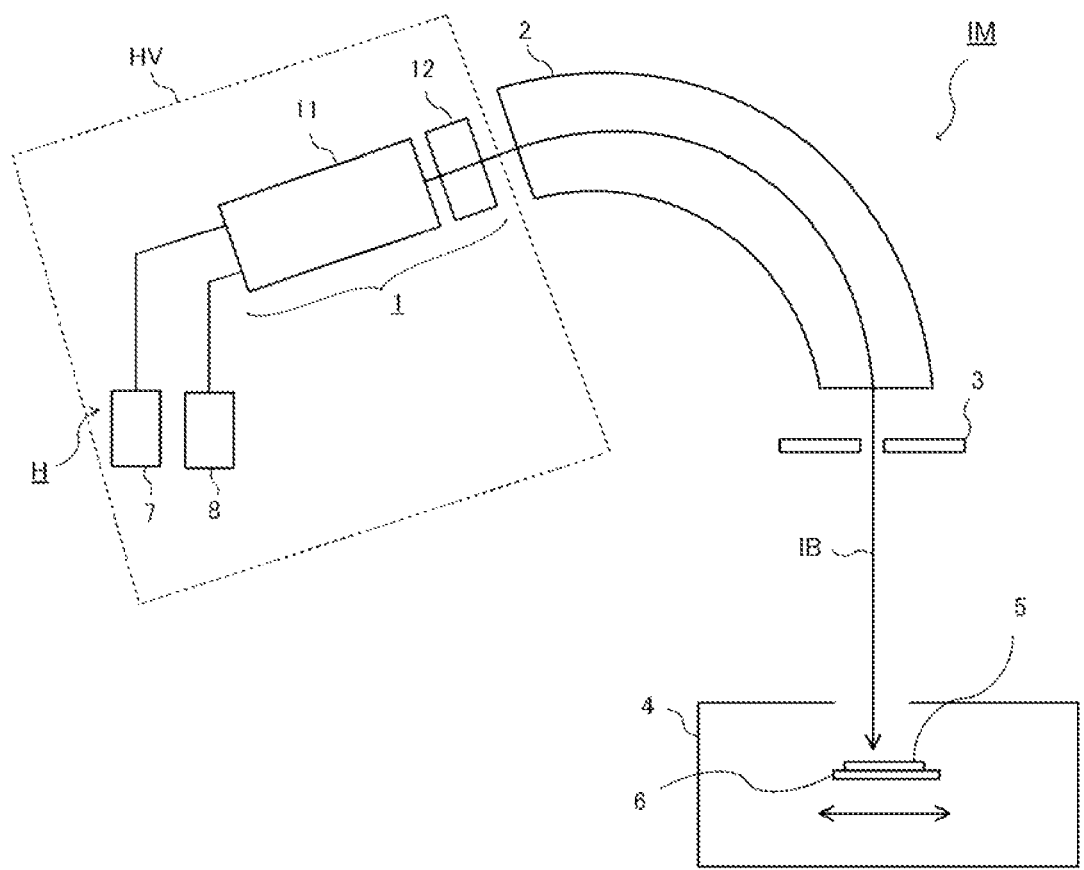
FIG. 1 is a schematic top plan view showing an example of a configuration of an ion implantation apparatus, according to an embodiment.

Various configurations may be employed to supply hydrogen gas in an ion implantation apparatus. For example, in the related art, hydrogen gas may be supplied from a hydrogen generator disposed in a gas box to an ion source.

However, since the hydrogen generator is configured to generate hydrogen by electrolysis of water, a configuration of the hydrogen generator becomes complicated and relatively large in size.

Further, the gas box is located in an area where high voltage (e.g., several hundred KV) is applied. Thus, if the hydrogen generator is a device that electrically generates hydrogen and is disposed in the high voltage area, there is a risk of serious accidents due to electrical leakage or water leakage.

Moreover, during the generation of the hydrogen, the hydrogen generator also generates components other than hydrogen (e.g., atmospheric components and moisture), in minute amounts.

Therefore, a technical problem to be addressed is to provide a hydrogen supply device capable of realizing stable hydrogen supply with a simple configuration, and an ion implantation apparatus equipped with the hydrogen supply device.

Various embodiments herein provide a hydrogen supply device disposed in a high-potential section of the ion irradiation apparatus, wherein the hydrogen supply device comprises a bottle internally provided with a hydrogen absorbing alloy.

According to the bottle provided internally with the hydrogen absorbing alloy, a hydrogen supply may be controlled by opening and closing the bottle, so that it becomes possible to simplify the configuration of the hydrogen supply device.

Further, in comparison with the related art hydrogen generator, the hydrogen supply device according to various embodiments does not require electricity or water for generating hydrogen, so that it becomes possible to avoid the risk of accidents due to electrical leakage or water leakage, even when the hydrogen supply device is disposed in a high-potential area of the ion irradiation apparatus. In addition, the hydrogen absorbing alloy is capable of continuously supplying high-purity hydrogen gas. This continuous supply makes it possible to realize a stable hydrogen supply with a simple configuration.

With a view to more stably performing the hydrogen supply, the hydrogen supply device may further comprise a temperature rise prevention part to prevent a temperature rise of the bottle.

Since the amount of hydrogen supplied using the hydrogen absorbing alloy has a temperature dependence, the temperature rise prevention part to prevent a temperature rise of the bottle may be provided to allow the hydrogen supply to be stably performed.

The temperature rise prevention part may be configured to supply cool air to the bottle.

The temperature rise prevention part to supply cool air to the bottle makes it possible to simplify a configuration around the bottle.

With a view to more effectively preventing the temperature rise of the bottle, the hydrogen supply device may comprise a thermal insulator disposed around the bottle.

With a view to more accurately controlling an amount of hydrogen supplied from the bottle, the hydrogen supply device may comprise a controller configured to control a temperature of the bottle by using the temperature rise prevention part, according to a pressure of hydrogen gas supplied from the bottle and/or the temperature of the bottle.

Various embodiments also provide an ion implantation apparatus which comprises the hydrogen supply device; and an ion source to which hydrogen gas is supplied from the hydrogen supply device.

According to various embodiments, hydrogen supply may be controlled by opening and closing the bottle, so that it becomes possible to simplify the configuration of the hydrogen supply device.

Further, in contrast with the related art hydrogen generator, the hydrogen supply device according to various embodiments does not require electricity or water for generating hydrogen, so that it becomes possible to avoid the risk of accidents due to electrical leakage or water leakage, even when the hydrogen supply device is disposed in a high-potential area of the ion irradiation apparatus. In addition, the bottle provided with the hydrogen absorbing alloy is capable of continuously supplying high-purity hydrogen gas. This configuration makes it possible to realize a stable hydrogen supply with a simple configuration.

Various embodiments will now be described with reference to the drawings in which like reference designators are used to refer to like components throughout.

FIG. 1 is a schematic top plan view showing an example of a configuration of an ion implantation apparatus IM. The ion implantation apparatus IM is roughly divided into three sections: an ion source section, a beamline section, and an end station section.

The ion source section is a section where an ion beam IB is generated, and comprises an ion source 1 including a plasma generation chamber 11 in which plasma is generated, and an extraction electrode 12 for extracting an ion beam IB from the plasma generation chamber 11. One or more bottles are connected to the plasma generation chamber 11 to supply gas which is the source of plasma. In the configuration example illustrated in FIG. 1, a first bottle 7 and a second bottle 8 are connected to the plasma generation chamber 11. In some embodiments, the ion source section may further include the first bottle 7 and the second bottle 8.

The first bottle 7 is used to supply hydrogen gas to the plasma generation chamber 11, and is internally provided with an alloy capable of absorbing and desorbing (i.e., releasing) hydrogen. The alloy thus acts as a storage for storing hydrogen, which may then be released. The alloy is hereinafter referred to in this specification as a "hydrogen absorbing alloy" without loss of generality. The alloy may alternatively be referred to in some contexts as a "hydrogen absorbing and desorbing alloy" in which a hydrogen absorption/discharge pressure changes with temperature. The hydrogen absorbing alloy may be, for example, a magnesium alloy, a titanium alloy, a vanadium alloy, a lanthanum alloy, or the like. The first bottle 7 serves as a hydrogen supply device H, as described later.

The second bottle 8 is used to supply, to the plasma generation chamber 11, e.g., a dopant gas containing ion species to be implanted into a wafer, or gas (which contains BF3, PF3 or the like) for use in generation of ions from a sputtering target provided inside the plasma generation chamber 11.

The ion source section is disposed in a high-potential section HV having a potential of several hundred KV which is higher than a potential the beamline section and the end station section. In some embodiments, the ion source section may be considered to be equivalent to the high-potential section HV.

The ion beam IB extracted from the ion source 1 is transported to the beamline section. In the beamline section, ions to be implanted into the wafer are selected through an analysis electromagnet 2 and an analysis slit 3. The ion beam IB passing through the beamline section is transported to the end station section.

In the end station section, ion implantation processing is performed for the below-mentioned wafer 5 in a processing chamber 4. In the processing chamber 4, a wafer 5 (e.g., a semiconductor wafer such as a silicon wafer) is held by a holder 6, and conveyed by a non-illustrated drive mechanism reciprocatingly one or more times in the directions indicated by the mowed line in FIG. 1, such that it moves across the ion beam IB introduced into the processing chamber 4. This reciprocating movement of the wafer 5 allows the entire surface of the wafer to be irradiated with the ion beam IB, thereby realizing the ion implantation processing for the wafer 5 by the ion beam IB.

Here, it is assumed that, in FIG. 1, the dimension of the ion beam IB extracted from the ion source 1, in a front-back direction with respect to the drawing sheet, is greater than the dimension of the wafer 5 in the same direction.

Figure 2:
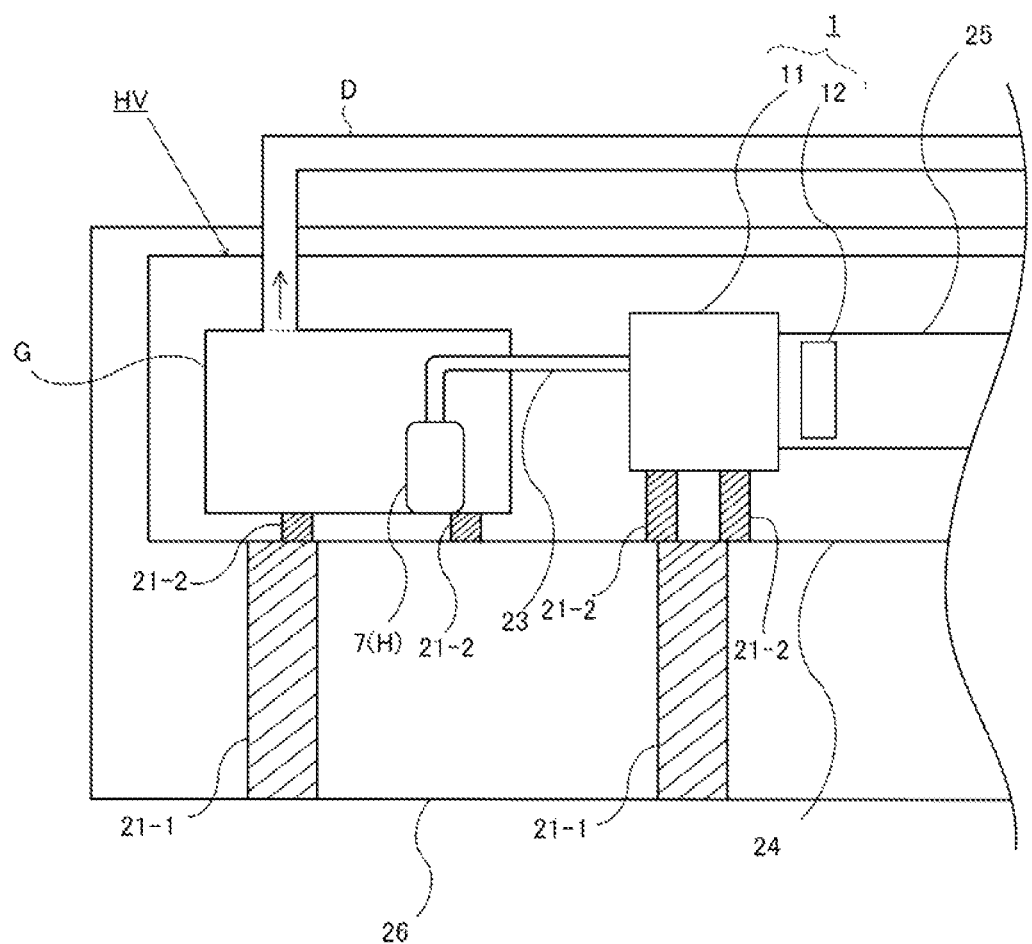
FIG. 2 is a schematic top plan view showing a portion of a high-potential section of the ion implantation apparatus that include a hydrogen supply device, according to an embodiment.

FIG. 2 is a schematic top plan view showing a portion of a high-potential section of the ion implantation apparatus that includes a hydrogen supply device, according to an embodiment.

As illustrated in FIG. 2, the high-potential section HV includes an interior housing 24. The interior housing 24 is supported by one or more first insulators 21-1 with respect to an exterior housing 26, which serves as an outer wall of the apparatus. A high voltage of several hundred KV is applied to the interior housing 24. The exterior housing 26 is insulated from the interior housing 24 by the one or more insulators 21-1.

A gas box G and the ion source 1 are arranged within the interior housing 24, and one or more second insulators 21-2 are disposed between the interior housing 24 and the gas box G and the ion source 1 such that the gas box G and the ion source 1 are supported by the one or more second insulators 21-2 individually with respect to the interior housing 24. The gas box G and the ion source 1 are connected together through an electrically-conductive pipe 23, so that the potential of these sections is different from the potential of the interior housing 24 by several tens of KV.

An ion beam (not illustrated in FIG. 2) extracted from the ion source 1 is transported to the end station section via a downstream vacuum chamber 25.

The gas box G is internally provided with the first bottle 7 and the second bottle 8 (not illustrated in FIG. 2). An exhaust duct D, e.g., a factory exhaust duct, is connected to the gas box G. Thus, in the event of a gas leakage in the gas box G, leaked gas may be discharged to the outside of the apparatus via the exhaust duct D.

The first bottle 7 is internally provided with a hydrogen absorbing alloy which stores hydrogen for later release. Hydrogen may be supplied to the plasma generation chamber 11 via the electrically-conductive pipe 23 by opening a valve (not illustrated) of the first bottle 7. In the configuration example illustrated in FIG. 2, the first bottle 7 internally provided with the hydrogen absorbing alloy is equivalent to the hydrogen supply device H.

In the embodiment illustrated in FIGS. 1-2, hydrogen supply may be controlled by opening and closing the bottle, so that it becomes possible to simplify the configuration of the hydrogen supply device. Further, in contrast with the related art hydrogen generator, the hydrogen supply device using the hydrogen absorbing alloy does not require electricity or water for generating hydrogen, so that it becomes possible to avoid the risk of accidents due to electrical leakage or water leakage, even when the hydrogen supply device is disposed in a high-potential area.

In the related art hydrogen generator using electrolysis of water, during hydrogen supply, atmospheric components and moisture are constantly generated in minute amounts. On the other hand, in the hydrogen supply device using the hydrogen absorbing alloy according to various embodiments, if an undesired gas other than hydrogen is absorbed during absorption, a small amount of the undesired gas will be released in a short time after opening the bottle. Thereafter, high-purity hydrogen gas is constantly released after release of the small amount of the undesired gas. That is, the undesired gas and the hydrogen gas may be supplied in a separated state, such that the undesired gas is limited to a small amount over a short time rather than being constantly generated in minute amounts as in the related art, and it becomes possible to supply a high-purity hydrogen gas on a continuing basis.

The hydrogen absorbing alloy makes it possible to realize stable hydrogen supply with a simple configuration.

Figure 3:
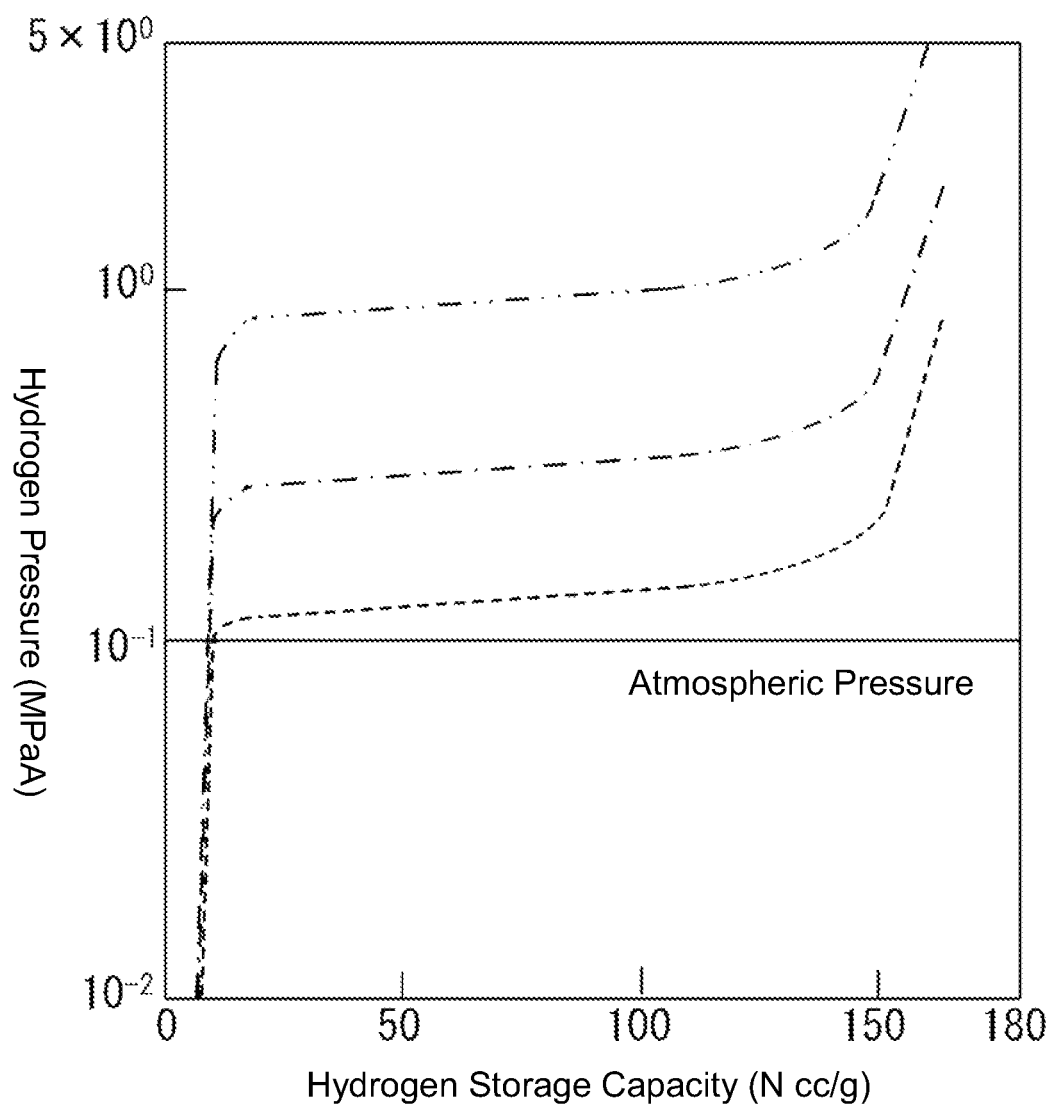
FIG. 3 is a graph showing a relationship between a pressure and a temperature of a hydrogen gas that is supplied.

FIG. 3 is a graph showing a relationship between a pressure and a temperature of a hydrogen gas that is supplied. The temperature of the ion source 1 rises along with operation of the ion source 1. As the temperature of the ion source 1 rises, the temperature of the gas box G disposed around the ion source 1 also rises. The pressure of hydrogen gas released from the hydrogen absorbing alloy has a temperature dependence as illustrated in FIG. 3. In FIG. 3, the broken line, one-dot chain line and two-dot chain line correspond, respectively, to curves at temperatures of 0° C., 20° C. and 50° C.

FIG. 3 shows that as the temperature largely varies, the pressure of hydrogen gas released from the hydrogen absorbing alloy also largely fluctuates.

In order to stabilize the amount of hydrogen gas supplied to the plasma generation chamber 11, it is advantageous to suppress the pressure fluctuation along with the rise in temperature.

Further, considering that a high hydrogen gas supply pressure may be subjected to laws and regulations, depending on the destination of the apparatus, it is required to suppress the temperature rise so as to maintain a given pressure falling within a regulatory range, in some cases.

Figure 4:
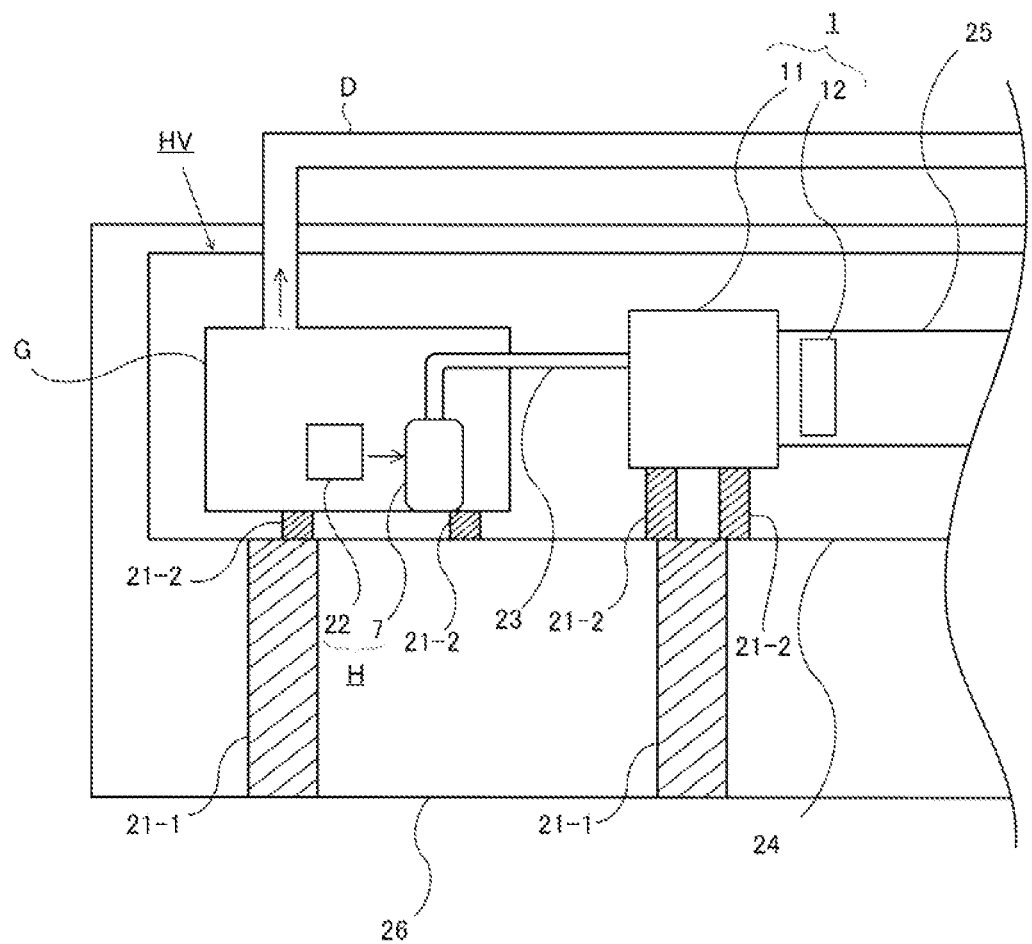
FIG. 4 is a schematic top plan view showing a portion of a high-potential section of the ion implantation apparatus that uses a hydrogen supply device, according to an embodiment.

Thus, in order to suppress the temperature rise or pressure rise, a configuration illustrated in FIG. 4 may be provided.

FIG. 4 is a schematic top plan view showing a portion of a high-potential section of the ion implantation apparatus that uses a hydrogen supply device, according to an embodiment. As compared with the configuration in FIG. 2, the configuration in FIG. 4 is different in that the hydrogen supply device H comprises a temperature rise prevention part 22. The temperature rise prevention part 22 prevents the temperature rise of the first bottle 7 due to an external heat source.

FIGS. 5A to 5E show examples of the hydrogen supply device H in FIG. 4, according to various embodiments. Specifically, one or more of the configurations as shown in FIGS. 5A to 5E may be adopted as the temperature rise prevention part 22.

Figure 5:
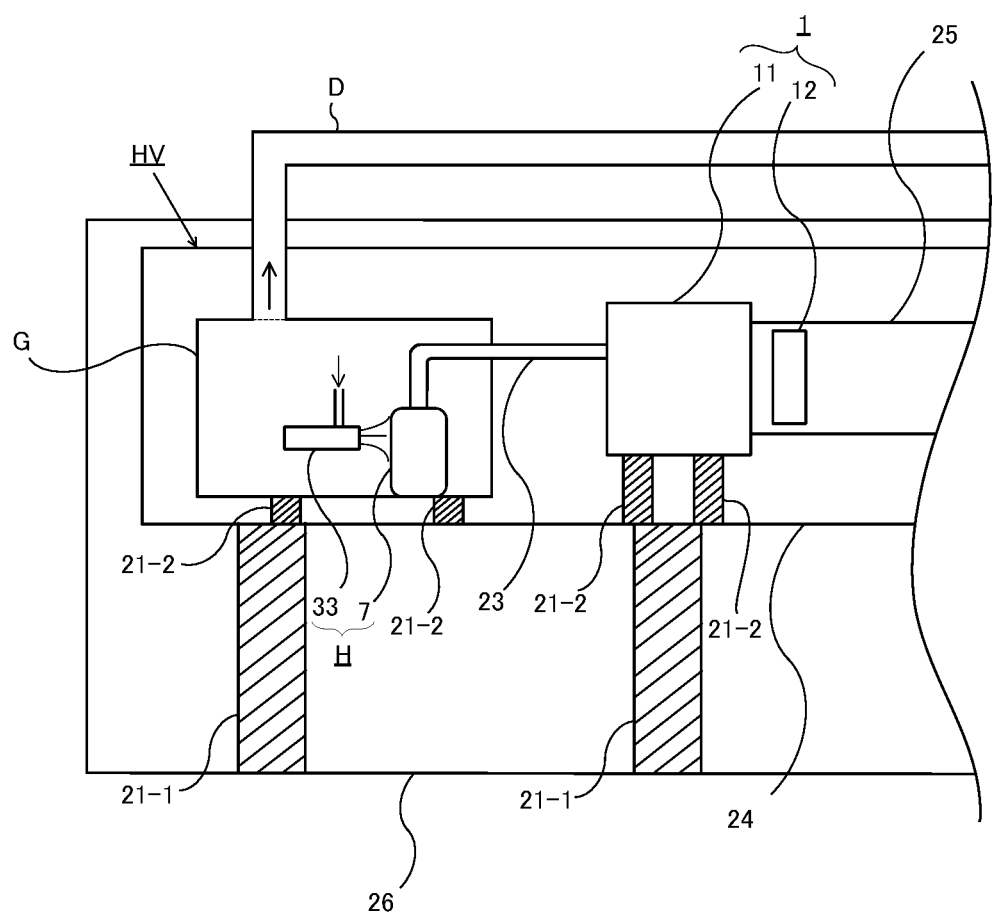
FIGS. 5A to 5E are explanatory diagrams showing modifications of the hydrogen supply device in FIG. 4.
Figure 5:
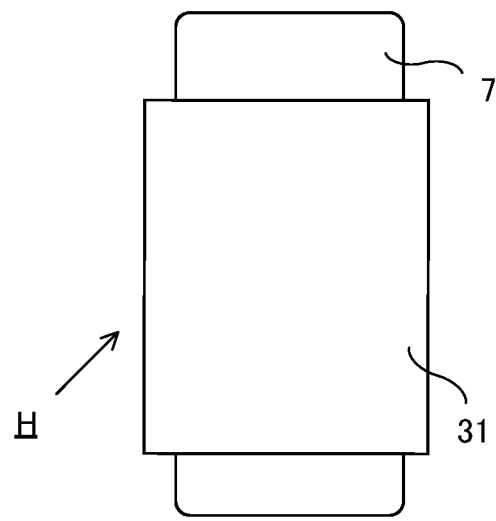

In the configuration example illustrated in FIG. 5A, an air jet cooler 33 may be used as a specific example of the temperature rise prevention part 22. The air jet cooler 33 is a tubular element configured to, when compressed air is fed to the inside thereof, discharge warm air from one of opposite ends thereof, and discharge cool air from the other end of opposite ends thereof. The air jet cooler 33 neither requires electricity for power nor uses water like water cooling, so that it is excellent in that there is no risk of accidents due to electrical leakage or water leakage in the high potential section HV.

By cooling the first bottle 7 using the air jet cooler 33 as the temperature rise prevention part 22, it becomes possible to suppress the temperature rise of the first bottle 7, thereby stabilizing the hydrogen gas supply amount.

Here, the supply of compressed air to the air jet cooler 33 may be performed via a resin tube provided inside the exhaust duct D.

In FIG. 5B, a thermal insulator 31 may be used as a specific example of the temperature rise prevention part 22. The thermal insulator 31 is provided around the first bottle 7. The thermal insulator 31 makes it possible to prevent heat transfer from the side of the ion source 1 to the first bottle 7.

Figure 5C:
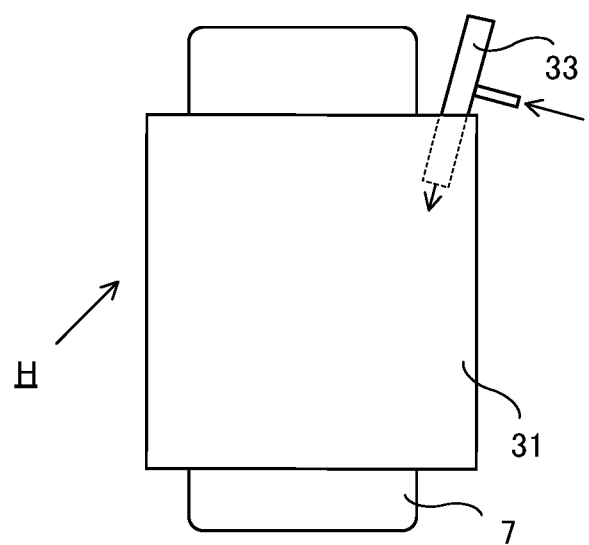

It should be noted here that, in a case where there is difficulty in completely blocking around the first bottle 7 with the thermal insulator 31 or the after-mentioned temperature control for the first bottle 7 is performed, the air jet cooler 33 and the thermal insulator 31 may be used together, as illustrated in FIG. 5C. In this case, the thermal insulator 31 also plays a role in keeping the first bottle 7 cooled by the air jet cooler 33 at a low temperature.

As illustrated in FIG. 5C, the circumference of the first bottle 7 may be partly covered with the thermal insulator 31, and cold air may be supplied from above a portion of the first bottle 7 which is not covered with the thermal insulator 31, by the air jet cooler 33. Alternatively, in some embodiments, a hole may be made in a part of the thermal insulator 31, and cool air may be supplied through the hole, by the air jet cooler 33.

Figure 5D:
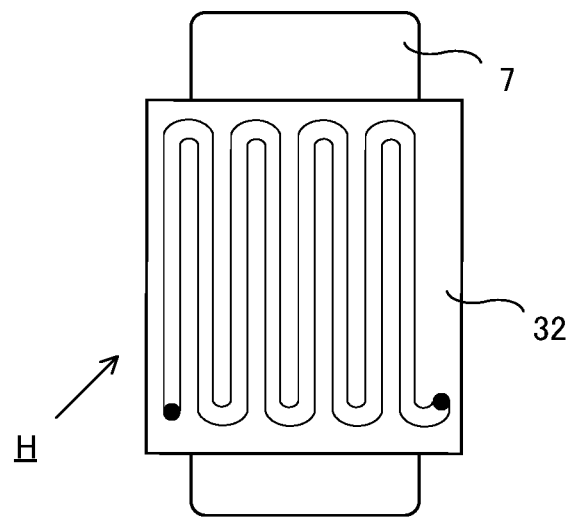

In FIG. 5D, a water-cooling jacket 32 may be used as a specific example of the temperature rise prevention part 22. The water-cooling jacket 32 is provided around the first bottle 7.

Figure 5E:
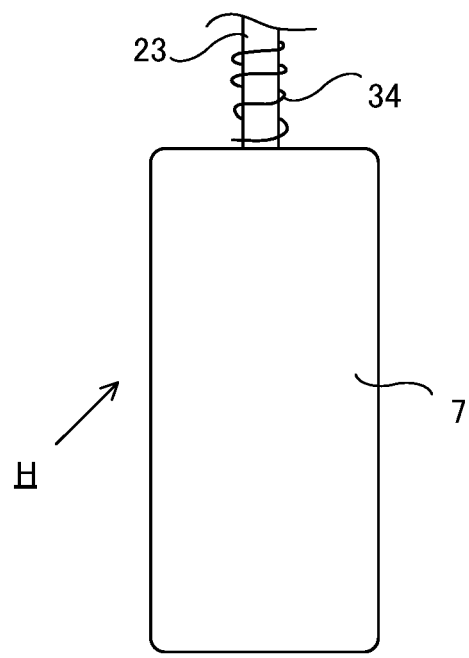

In FIG. 5E, a cooling tube 34 may be used as a specific example of the temperature rise prevention part 22. That is, in order to cool the first bottle 7 indirectly, the cooling tube 34 through which a cooling medium is flowing may be wrapped around the pipe 23 for supplying hydrogen gas from the first bottle 7.

As described above, the temperature rise prevention part 22 may be one or more of the air jet cooler 33, the thermal insulator 31, the water-cooling jacket 32, and the cooling tube 34. That is, the first bottle 7 may be cooled directly and/or indirectly to suppress the temperature rise thereof, as shown in FIGS. 4 and 5A through 5E.

In the configurations for cooling the first bottle 7 as described in FIG. 4 and FIG. 5A, 5C, 5D, or 5E, there may be a concern that the first bottle 7 may be excessively cooled. From a viewpoint of this concern, the configuration as shown in FIG. 6 may be adopted.

Figure 6:
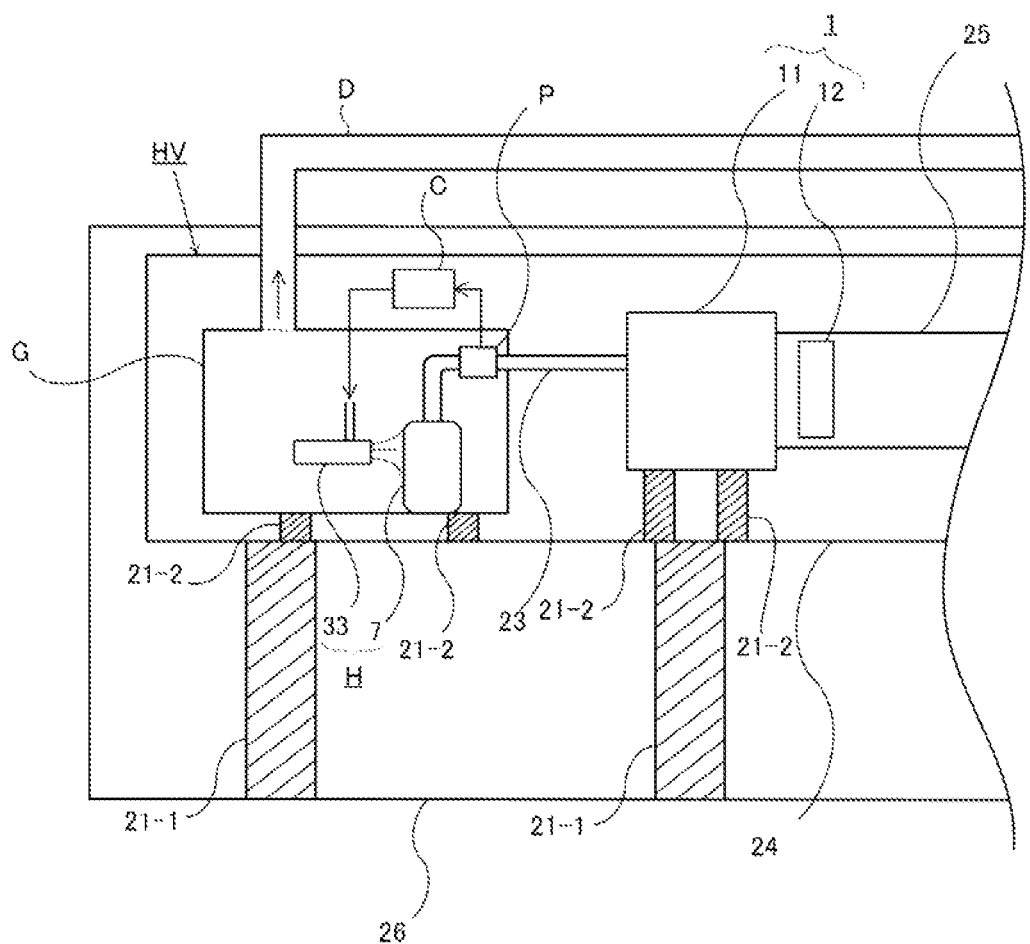
FIG. 6 is a schematic top plan view showing a portion of a high-potential section of the ion implantation apparatus using a hydrogen supply device, according to an embodiment.

FIG. 6 is a schematic top plan view showing a portion of a high-potential section of the ion implantation apparatus using a hydrogen supply device, according to an embodiment. In FIG. 6, the output of the air jet cooler 33 may be controlled. More specifically, the pressure of hydrogen gas supplied from the first bottle 7 to the pipe 23 is measured by a pressure gauge P, and the output of the air jet cooler 33 is controlled by a controller C based on a result of the measurement. The controller C may be a microprocessor, a microcontroller, a flow controller, or control logic configured to receive a signal from the pressure gauge P indicating the pressure and control the air jet cooler 33 based on the received signal. In some embodiments, other parameters in addition to or in place of the signal indicating the pressure may be used by the controller C to control the air jet cooler 33. Such feedback control makes it possible to prevent overcooling of the bottle and more accurately control of the hydrogen supply amount. While FIG. 6 shows a configuration in which the air jet cooler 33 is controlled, embodiments are not limited thereto. In other embodiments, the water-cooling jacket 32 or the cooling tube 34 may be controlled.

As described in connection with FIG. 3, in the hydrogen supply device H using the hydrogen absorbing alloy, the pressure (flow rate) of hydrogen gas supplied fluctuates according to the temperature of the bottle provided with the hydrogen absorbing alloy. Thus, the temperature of the bottle provided with the hydrogen absorbing alloy may be measured, in addition to or instead of measuring the pressure of hydrogen gas passing through the pipe 23 as shown in FIG. 6, and the output of the air jet cooler 33 may be controlled such that the temperature of the bottle reaches a threshold value. The value may be predetermined.

The output of the air jet cooler 33 may be controlled such that it is continuously changed, or it is appropriately switched on and off.

The hydrogen supply device H has been described based on an example in which the hydrogen supply device H is installed in the high-potential section HV of the ion implantation apparatus IM, as shown in FIG. 1. However, embodiments are not limited thereto. In some embodiments, the hydrogen supply device H may be installed in any suitable apparatus other than the ion implantation apparatus IM. For example, the hydrogen supply device H may be installed in an apparatus for processing wafers using an ion beam, wherein the apparatus is equipped with an ion source to which hydrogen gas is supplied from the hydrogen supply device H according to various embodiments. In this specification, the above apparatus for processing wafers using an ion beam, including an ion implantation apparatus, is referred to as "ion beam irradiation apparatus".

In the ion beam irradiation apparatus, the configuration of the beamline section may be appropriately modified according to the details of the wafer processing, or the beamline section itself may be omitted.

Further, in some embodiments, the hydrogen gas supplied from the hydrogen supply device H according to various embodiments may be used in the form of a mixed gas with a halogen-containing dopant gas. However, the use of hydrogen gas is not limited to such a mixed gas.

For example, in a case where hydrogen ions are produced from hydrogen gas supplied by the hydrogen supply device H according to various embodiments, and extracted as a hydrogen ion beam, no other gases are needed.

It should be understood that, while various embodiments have been described, various other changes and modifications may be made therein without departing from the spirit and scope as set forth in appended claims.

What is claimed is:

1. A hydrogen supply device disposed in a high-potential section, the hydrogen supply device comprising a bottle internally provided with a hydrogen absorbing alloy.

2. The hydrogen supply device as recited in claim 1, further comprising a temperature rise prevention part that prevents a temperature rise of the bottle.

3. The hydrogen supply device as recited in claim 1, further comprising an air jet cooler configured to supply cool air to the bottle.

4. The hydrogen supply device as recited in claim 3, further comprising a thermal insulator disposed around at least a portion of the bottle.

5. The hydrogen supply device as recited in claim 1, further comprising a thermal insulator disposed around at least a portion of the bottle.

6. The hydrogen supply device as recited in claim 1, further comprising a water-cooling jacket disposed around at least a portion of the bottle.

7. The hydrogen supply device as recited in claim 3, further comprising a controller configured to control the air jet cooler based on a pressure of hydrogen gas supplied from the bottle or a temperature of the bottle.

8. An ion beam irradiation apparatus comprising:
an ion source; and
the hydrogen supply device as recited in claim 1, the hydrogen supply device that supplies a hydrogen gas to the ion source.

9. The ion beam irradiation apparatus as recited in claim 8, wherein the hydrogen supply device further comprises a temperature rise prevention part that prevents a temperature rise of the bottle.

10. The ion beam irradiation apparatus as recited in claim 8, wherein the hydrogen supply device further comprises an air jet cooler configured to supply cool air to the bottle.

11. The ion beam irradiation apparatus as recited in claim 10, wherein the hydrogen supply device further comprises a thermal insulator disposed around at least a portion of the bottle.

12. The ion beam irradiation apparatus as recited in claim 8, wherein the hydrogen supply device further comprises a thermal insulator disposed around at least a portion of the bottle.

13. The ion beam irradiation apparatus as recited in claim 8, wherein the hydrogen supply device further comprises a water-cooling jacket disposed around at least a portion of the bottle.

14. The ion beam irradiation apparatus as recited in claim 8, further comprising a pipe communicatively connected from the bottle to the ion source, wherein the hydrogen supply device further comprises cooling tube wrapped around at least a portion of the pipe and configured to receive cooling water.

15. The ion beam irradiation apparatus as recited in claim 10, wherein the hydrogen supply device further comprises a controller configured to control the air jet cooler based on a pressure of the hydrogen gas or a temperature of the bottle.

16. An ion beam irradiation apparatus comprising:
a housing;
a gas box disposed in the housing;
an ion source disposed in the housing;
one or more insulator disposed between the housing and each of the gas box and the ion source,
wherein the gas box includes the hydrogen supply device as recited in claim 1, and
the hydrogen supply device supplies a hydrogen gas to the ion source through a pipe that passes through a wall of the gas box.

17. The ion beam irradiation apparatus as recited in claim 16, wherein the housing is at a potential of several hundred kilovolts (KV), and the gas box and the ion source have an electrical potential different from the potential of the housing by several tens of KV.

18. The ion beam irradiation apparatus as recited in claim 16, wherein the hydrogen supply device further comprises an air jet cooler configured to supply cool air to the bottle.

19. The ion beam irradiation apparatus as recited in claim 18, wherein the hydrogen 17 supply device further comprises a thermal insulator disposed around at least a portion of the bottle.

20. The ion beam irradiation apparatus as recited in claim 16, wherein the hydrogen supply device further comprises a thermal insulator disposed around at least a portion of the bottle.

* * * * *